(12) United States Patent
Yang et al.

(10) Patent No.: US 10,964,528 B2
(45) Date of Patent: *Mar. 30, 2021

(54) INTEGRATION OF MATERIALS REMOVAL AND SURFACE TREATMENT IN SEMICONDUCTOR DEVICE FABRICATION

(71) Applicants: Mattson Technology, Inc., Fremont, CA (US); Beijing E-Town Semiconductor Technology, Co., LTD, Beijing (CN)

(72) Inventors: Michael X. Yang, Palo Alto, CA (US); Hua Chung, Saratoga, CA (US); Xinliang Lu, Fremont, CA (US); Haochen Li, Fremont, CA (US); Ting Xie, Fremont, CA (US); Qi Zhang, San Jose, CA (US)

(73) Assignees: Mattson Technology, Inc., Fremont, CA (US); Beijing E-Town Semiconductor Technology Co., Ltd., Beijing (CN)

(*) Notice: Subject to any disclaimer, the term of this patent is extended or adjusted under 35 U.S.C. 154(b) by 0 days.

This patent is subject to a terminal disclaimer.

(21) Appl. No.: 16/522,193

(22) Filed: Jul. 25, 2019

(65) Prior Publication Data

US 2020/0185216 A1 Jun. 11, 2020

Related U.S. Application Data

(63) Continuation of application No. 16/216,006, filed on Dec. 11, 2018, now Pat. No. 10,403,492.

(51) Int. Cl.
*H01L 21/02* (2006.01)
*H01J 37/32* (2006.01)
(Continued)

(52) U.S. Cl.
CPC .... *H01L 21/02063* (2013.01); *H01J 37/3244* (2013.01); *H01J 37/32357* (2013.01);
(Continued)

(58) Field of Classification Search
CPC ......... H01L 21/02063; H01L 21/02381; H01L 21/02532; H01L 21/0262; H01L 21/28525;
(Continued)

(56) References Cited

U.S. PATENT DOCUMENTS 4,885,067 A 12/1989 Doty
5,275,798 A 1/1994 Aida
(Continued)

FOREIGN PATENT DOCUMENTS

KR 10-0777043 11/2007
KR 10-2013-0056595 5/2013
(Continued)

OTHER PUBLICATIONS

PCT International Search Report and Written Opinion for corresponding PCT Application No. PCT/US2019/062740, dated Mar. 17, 11 pages.
(Continued)

*Primary Examiner* — Duy Vu N Deo
(74) *Attorney, Agent, or Firm* — Dority & Manning, P.A.

(57) ABSTRACT

Processes for surface treatment of a workpiece are provided. In one example implementation, organic radicals (e.g., methyl $CH_3$ radicals) can be generated by exciting and/or dissociating hydrogen and/or inert gas (e.g., Ar, He, etc) molecules in a remote plasma source and a subsequent reaction with organic molecule (alkanes and alkenes). The organic radicals (e.g., methyl $CH_3$ radicals) can be exposed to the silicon and/or silicon germanium surfaces. After exposure to the organic radicals, the silicon and/or silicon
(Continued)

germanium surfaces can be stable in air for a time period (e.g., days) with reduced surface oxidation such that the silicon and/or silicon germanium surfaces can be effectively protected from oxidation. As such, native surface oxide removal process before subsequent process steps can be eliminated.

15 Claims, 9 Drawing Sheets

(51) Int. Cl.
- *H01L 21/285* (2006.01)
- *H01L 21/3213* (2006.01)
- *H01L 21/67* (2006.01)

(52) U.S. Cl.
CPC .... *H01L 21/0262* (2013.01); *H01L 21/02381* (2013.01); *H01L 21/02532* (2013.01); *H01L 21/28525* (2013.01); *H01L 21/32136* (2013.01); *H01L 21/67028* (2013.01); *H01L 21/67069* (2013.01)

(58) Field of Classification Search
CPC ......... H01L 21/32136; H01L 21/67028; H01L 21/67069; H01L 21/306; H01J 37/32357; H01J 37/3244
USPC ........................................... 438/706
See application file for complete search history.

(56) References Cited

U.S. PATENT DOCUMENTS

| | | | |
|---|---|---|---|
| 5,811,022 A | 9/1998 | Savas et al. | |
| 6,028,015 A | 2/2000 | Wang | |
| 6,107,197 A | 8/2000 | Suzuki | |
| 6,677,251 B1 | 1/2004 | Lu | |
| 7,541,200 B1 | 6/2009 | Schravendijk et al. | |
| 7,604,708 B2 | 10/2009 | Wood et al. | |
| 7,807,579 B2 | 10/2010 | Yang | |
| 7,901,743 B2 | 3/2011 | Lee et al. | |
| 8,821,987 B2 | 9/2014 | Shanker | |
| 9,214,319 B2 | 12/2015 | Nagorny et al. | |
| 9,837,270 B1 | 12/2017 | Varadarajan et al. | |
| 10,269,574 B1* | 4/2019 | Yang ................... | H01L 21/0271 |
| 10,403,492 B1* | 9/2019 | Yang ................... | H01J 37/3244 |
| 2003/0042465 A1 | 3/2003 | Ko | |
| 2003/0134051 A1 | 7/2003 | Jung et al. | |
| 2004/0154743 A1 | 8/2004 | Savas | |
| 2006/0081273 A1 | 4/2006 | McDermott | |
| 2007/0072422 A1 | 3/2007 | Yeh | |
| 2007/0190266 A1 | 8/2007 | Fu | |
| 2008/0149690 A1* | 6/2008 | Dong ................ | H01J 37/32431 228/205 |
| 2008/0261405 A1 | 10/2008 | Yang | |
| 2009/0005027 A1 | 2/2009 | Goyal | |
| 2009/0274610 A1 | 11/2009 | Ghoanneviss et al. | |
| 2011/0117751 A1 | 5/2011 | Sonthalia | |
| 2012/0285481 A1 | 11/2012 | Lee et al. | |
| 2013/0034968 A1 | 2/2013 | Zhang | |
| 2014/0113532 A1 | 4/2014 | Smith | |
| 2014/0261186 A1 | 9/2014 | Cho | |
| 2015/0108493 A1 | 4/2015 | Kang | |
| 2015/0126027 A1 | 5/2015 | Matsumoto | |
| 2015/0239759 A1 | 8/2015 | Kang | |
| 2015/0303065 A1 | 10/2015 | Buckalew | |
| 2016/0020089 A1 | 1/2016 | Thadani | |
| 2016/0079062 A1 | 3/2016 | Zheng et al. | |
| 2016/0260616 A1 | 9/2016 | Li | |
| 2016/0276134 A1 | 9/2016 | Collins | |
| 2017/0029950 A1 | 2/2017 | Chen | |

FOREIGN PATENT DOCUMENTS

| | | |
|---|---|---|
| WO | WO 2010-045153 | 4/2010 |
| WO | WO 2017/147365 | 8/2017 |

OTHER PUBLICATIONS

Bao et al., "Mechanistic Study of Plasma Damage and CH4 Recovery of Low k Dielectric Surface," 2007 IEEE International Interconnect Technology Conference, Jun. 4-6, 2007, pp. 1-3.

"HMDS," Retrieved from the internet May 17, 2018, https://www.microchemicals.com/products/adhesion_promotion/hmds.html—2 pages.

* cited by examiner

INTEGRATION OF MATERIALS REMOVAL AND SURFACE TREATMENT IN SEMICONDUCTOR DEVICE FABRICATION

PRIORITY CLAIM

The present application is based on and claims priority to U.S. application Ser. No. 16/216,006, having a filing date of Dec. 11, 2018, entitled "Integration Of Materials Removal And Surface Treatment In Semiconductor Device Fabrication," which is incorporated by reference herein.

FIELD

The present disclosure relates generally to surface treatment of a workpiece.

BACKGROUND

Plasma processing is widely used in the semiconductor industry for deposition, etching, resist removal, and related processing of semiconductor wafers and other substrates. Plasma sources (e.g., microwave, ECR, inductive, etc.) are often used for plasma processing to produce high density plasma and reactive species for processing substrates. Post-implantation photoresist, post-etch residue, and other mask and/or material removal have been accomplished using plasma dry strip processes. In plasma dry strip processes, neutral particles from a plasma generated in a remote plasma chamber pass through a separation grid into a processing chamber to treat a substrate, such as a semiconductor wafer.

SUMMARY

Aspects and advantages of embodiments of the present disclosure will be set forth in part in the following description, or may be learned from the description, or may be learned through practice of the embodiments.

One example aspect of the present disclosure is directed to a method for processing a workpiece. The workpiece can include semiconductor material. The method can include performing an organic radical based surface treatment process to the workpiece to protect the workpiece from oxidation. The organic radical based surface treatment process can include generating one or more species using a plasma induced in a first chamber. The organic radical based surface treatment process can further include mixing one or more hydrocarbon molecules with the one and more species to create a mixture at downstream flow from the plasma. The mixture can include one or more organic radicals.

Another example aspect of the present disclosure is directed to a method of processing a semiconductor workpiece. The semiconductor workpiece can include a semiconductor material of silicon or silicon germanium. The method can include generating one or more excited species in an inert gas in a plasma chamber by inducing a plasma in the inert gas with an inductively coupled plasma source. The method can include generating one or more organic radicals by mixing one or more hydrocarbon molecules with the excited species outside of the first chamber and at downstream flow from the first chamber to generate a mixture, the mixture comprising one or more organic radicals. The method can include exposing an oxidation-free surface of the semiconductor material to the organic radicals.

Other example aspects of the present disclosure are directed to systems, methods, and apparatus for surface treatment of workpieces.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
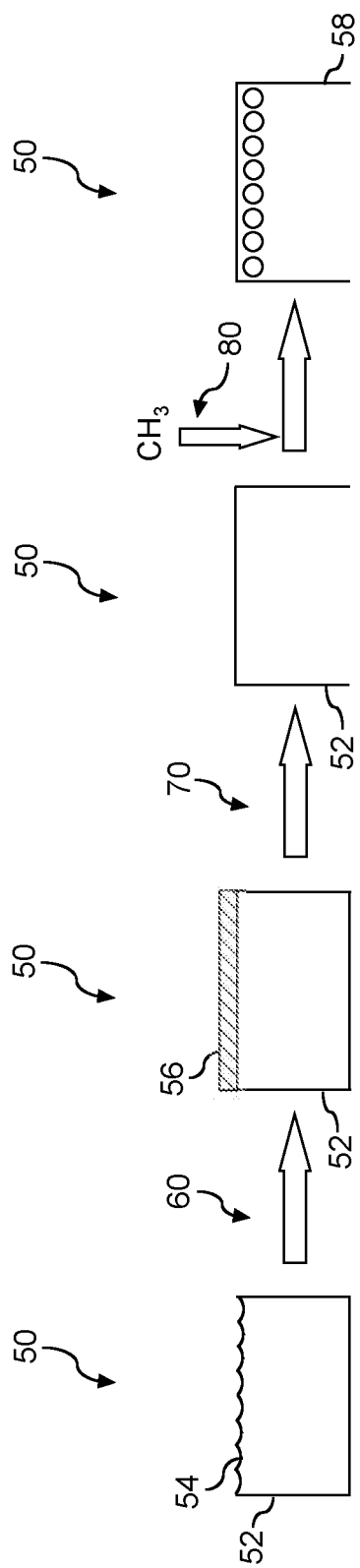
FIG. 1 depicts an example organic radical based surface treatment process on a structure according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to organic radical surface treatment processes for treating silicon and/or silicon germanium surfaces on a workpiece (e.g., a semiconductor wafer) to protect the workpiece from oxidation. A damage-free, oxidation-free silicon and/or silicon germanium substrate surface can be important in some instances for various semiconductor fabrication processes, including epitaxial film growth.

For example, damaged top layer on silicon (Si) and silicon germanium (SiGe) substrates can be removed (via a dry etch or wet etch process) first to obtain a suitable film quality in subsequent epitaxial growth. However, clean silicon and/or silicon germanium surfaces can get oxidized quickly upon air exposure.

Conventional methods can remove a native oxide layer on silicon and/or silicon germanium surfaces (e.g. via diluted hydrogen fluoride solutions) and then limit queue time before the subsequent epitaxial growth process. However, the conventional methods can have a significant challenge in fab operation as queue-time variation can lead to variation in process results and device performance.

According to examples aspects of the present disclosure, organic radicals (e.g., methyl $CH_3$ radicals) can be generated by exciting and/or dissociating hydrogen and/or inert gas (e.g., Ar, He, etc) molecules in a remote plasma source and a subsequent reaction with organic molecule (alkanes and alkenes). The organic radicals (e.g., methyl $CH_3$ radicals) can be exposed to the silicon and/or silicon germanium surfaces. After exposure to the organic radicals, the silicon and/or silicon germanium surfaces can be stable in air for a time period (e.g., days) with reduced surface oxidation such that the silicon and/or silicon germanium surfaces can be effectively protected from oxidation. As such, native surface oxide removal process before subsequent process steps can be eliminated. Sub-monolayer organic groups on the methylated silicon and/or silicon germanium surfaces can be removed from silicon and/or silicon germanium surfaces via high temperature anneal (e.g., greater than about 700° C.) or via some other treatment processes. For instance, an organic radical based surface treatment can be adopted for surface protection before epitaxial film growth. Organic radicals on the surface can be removed in a high temperature pre-anneal step at the beginning of the epitaxial film deposition processes.

One example aspect of the present disclosure is directed to a method for performing an organic radical based surface treatment process on a workpiece (e.g., silicon or silicon germanium materials) to protect the workpiece from oxidation. The organic radical based surface treatment process can include generating one or more species using a plasma induced in a first chamber (e.g., a plasma chamber). The process can include mixing one or more hydrocarbon molecules with the one or more species to create a mixture (e.g., one or more organic radicals) at downstream flow from the first chamber. In some embodiments, the process can include exposing an oxidation-free surface of the semiconductor material to the mixture in a second chamber (e.g., a processing chamber) such that the oxidation-free surface is protected from surface oxidation during a time period. As used herein, an "oxidation-free surface" refers to a surface where at least 80% of the surface is without oxidation.

Another example aspect of the present disclosure is directed to a method for performing an organic radical based surface treatment process on a workpiece (e.g., silicon or silicon germanium materials) to protect the workpiece from oxidation. The organic radical based surface treatment process can include generating one or more species using a plasma induced in a first chamber (e.g., a plasma chamber). The process can include filtering the one or more species to generate a filtered mixture. The process can include mixing one or more hydrocarbon molecules with the filtered mixture post filtering to create a mixture (e.g., one or more organic radicals) outside of the first chamber and at downstream flow from the first chamber. The process can include exposing an oxidation-free surface of the semiconductor material to the mixture in a second chamber (e.g., a processing chamber) such that the oxidation-free surface is protected from surface oxidation during a time period.

In some embodiments, the method can include performing a native oxide removal process on the workpiece to create the oxidation-free surface prior to the organic radical based surface treatment process. For instance, during a native oxide removal process, one or more native oxide layers on top of silicon and/or silicon germanium materials can be removed such that the silicon and/or silicon germanium materials can have oxidation-free surfaces. Subsequent to the native oxide removal process, the organic radical based surface treatment process can be performed to create methylated silicon and/or silicon germanium surfaces such that the oxidation-free surfaces can be stable in air for a time period (e.g., days) before subsequent process steps (e.g., epitaxial film deposition process).

In some embodiments, the method can include performing a cleaning process on the workpiece to remove a damaged layer of the workpiece prior to the native oxide removal process. For instance, damaged silicon and/or silicon germanium materials can be removed first, and then the native oxide removal process can be performed on non-damaged silicon and/or silicon germanium materials to create oxidation-free surfaces.

In some embodiments, the method can include performing an epitaxial film deposition process to deposit epitaxial film on top of the oxidation-free surface subsequent to performing the organic radical based surface treatment process. For instance, subsequent to the organic radical based surface treatment process, one or more epitaxial films can be deposited on top of the oxidation-free surface of silicon and/or silicon germanium materials.

In some embodiments, the method can include removing the organic radicals from the workpiece using a high temperature pre-anneal step prior to epitaxial film deposition process. For instance, prior to epitaxial film deposition process, organic radicals can be removed by a high temperature pre-anneal step (e.g., greater than about 700° C.) such that one or more epitaxial films can be deposited on top of the oxidation-free surface of silicon and/or silicon germanium materials.

In some embodiments, the organic radical based surface treatment process can result in methylation on at least a portion of the workpiece. For instance, when silicon and/or silicon germanium materials are exposed to $CH_3$, methylation of the surface can protect the silicon and/or silicon germanium materials from oxidation.

In some embodiments, the organic radical based surface treatment process can include generating one or more species in a plasma chamber that is separated from the processing chamber by a separation grid. The species can be generated, for instance, by inducting a plasma in a process gas. In some embodiments, the process gas can be an inert gas, such as helium, argon, xenon, etc. An inductive plasma generated using an inductive plasma source in the inert gas can generate one or more excited inert gas molecules (e.g., excited helium molecules).

In some embodiments, the organic radical based surface treatment process can include generating one or more hydrogen radicals in a plasma chamber that is separated from the processing chamber by a separation grid. The hydrogen radicals can be generated, for instance, by inducing a plasma in a process gas. The process gas, for instance, can be a mixture including hydrogen ($H_2$) and nitrogen ($N_2$) or can be a mixture including $H_2$ and helium (He) or can be a mixture including $H_2$ and Argon (Ar). In some other embodiments, the hydrogen radicals can be generated, for instance, using a heated filament, such as a heated tungsten filament.

The organic radical based surface treatment process can include filtering ions while allowing the passage of neutrals (e.g. excited inert gas molecules and/or hydrogen radicals) to generate a filtered mixture with neutrals for exposure to the workpiece. For instance, a separation grid can be used to filter ions generated in the plasma chamber and allow passage of neutrals through holes in the separation grid to the processing chamber for exposure to the workpiece.

In some embodiments, the neutrals can include one or more organic radicals, such as methyl ($CH_3$) radicals. The organic radicals can react with the surface of the Si and/or SiGe layers (e.g., via methylation) to form a protective layer for protecting the workpiece from oxidation. The organic radicals can be mixed with other gases and radicals, such as hydrogen.

In some embodiments, the organic radicals (e.g., $CH_3$ radicals) can be generated by dissociating one or more hydrocarbon molecules in the plasma chamber. Example hydrocarbon molecules can include, for instance, non-cyclic alkanes $C_nH_{2n+2}$ where n is greater than or equal to one and less than or equal to 10. For instance, the hydrocarbon molecules can include non-cyclic alkanes, such as methane $CH_4$, ethane $C_2H_6$, propane or iso-propane $C_3H_8$, etc.

In some embodiments, the hydrocarbon molecules can include cyclic alkanes $C_nH_{2n}$, where n is greater than or equal to five and less than or equal to ten. For instance, the hydrocarbon precursor can include cyclic alkanes such as cyclopentane $C_5H_{10}$, cyclohexane $C_6H_{12}$, methyl-cyclohexane, $C_7H_{14}$, dimethyl-cyclohexane $C_8H_{16}$, 1,3,5-trimethyl-cyclohexane $C_9H_{18}$, etc. In some embodiments, the hydrocarbon precursors can include alkenes $C_nH_{2n}$, where n is greater than or equal to two and less than or equal to ten, such as ethylene $C_2H_4$, propene $C_3H_6$, etc.

In some embodiments, the organic radicals (e.g., $CH_3$ radicals) can be generated by injecting a gas into post plasma mixtures. For instance, a plasma (e.g., $H_2$ plasma or inert gas plasma, such as He plasma) can be generated in a remote plasma chamber. A hydrocarbon ($CH_4$, etc.) can be injected into the mixture after the plasma source for generation of organic radicals (e.g., $CH_3$ radicals).

In some embodiments a separation grid assembly can filter a mixture (e.g., ion filtering) to create a filtered mixture. Post filtering, a hydrocarbon ($CH_4$, etc.) can be injected into the filtered mixture for generation of organic radicals (e.g., $CH_3$ radicals).

Example hydrocarbon molecules can include, for instance, non-cyclic alkanes $C_nH_{2n+2}$ where n is greater than or equal to one and less than or equal to 10. For instance, the hydrocarbon molecules can include non-cyclic alkanes, such as methane $CH_4$, ethane $C_2H_6$, propane or iso-propane $C_3H_8$, etc. In some embodiments, the hydrocarbon molecules can include cyclic alkanes $C_nH_{2n}$, where n is greater than or equal to five and less than or equal to ten. For instance, the hydrocarbon precursor can include cyclic alkanes such as cyclopentane $C_5H_{10}$, cyclohexane $C_6H_{12}$, methyl-cyclohexane, $C_7H_{14}$, dimethyl-cyclohexane $C_8H_{16}$, 1,3,5-trimethyl-cyclohexane $C_9H_{18}$, etc. In some embodiments, the hydrocarbon precursors can include alkenes $C_nH_{2n}$, where n is greater than or equal to two and less than or equal to ten, such as ethylene $C_2H_4$, propene $C_3H_6$, etc.

The organic radicals can be generated using other approaches. For instance, organic radicals can be generated using pyrolysis (thermal decomposition) of molecules (e.g., azomethane $CH_3$—N=N—$CH_3$) or UV-assisted molecule dissociation (e.g., acetone $CH_3COCH_3$).

The workpiece can be supported on a pedestal. The pedestal can include a temperature regulation system (e.g., one or more electrical heaters) used to control a temperature of the workpiece temperature during processing. In some embodiments, the organic radical based surface treatment process can be carried out with the workpiece at a temperature in the range of about 20° C. to about 500° C.

Aspects of the present disclosure are discussed with reference to a "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within ten percent (10%) of the stated numerical value. A "pedestal" refers to any structure that can be used to support a workpiece.

FIG. 1 depicts an example organic radical based surface treatment process on a structure 50 according to example embodiments of the present disclosure. The structure 50 includes a substrate 52 (e.g., silicon and/or silicon germanium materials) and a damaged layer 54.

A cleaning process 60 according to example aspects of the present disclosure can be conducted on the structure 50 to remove the damaged layer 54 on top of the substrate 52 such that the substrate 52 can be exposed. Due to oxidation, a native oxide layer 56 is generated on top of the substrate 52. A native oxide layer removal process 70 according to example aspects of the present disclosure can be conducted on the structure 50 to remove the native oxide layer 56 to create an oxidation-free surface of the substrate 52. Subsequent to the native oxide removal process 70, an organic radical (e.g., $CH_3$ radicals) based surface treatment 80 according to example aspects of the present disclosure can be conducted on the structure 50 to generate a methylated substrate 58 such that the oxidation-free surface of the substrate 52 can be protected from surface oxidation during a time period (e.g., days).

In some embodiments, the organic radical (e.g., $CH_3$ radicals) based surface treatment 80 according to example aspects of the present disclosure can be conducted on the substrate 52 prior to exposure to oxygen to prevent the formation of the native oxide layer 56. In this example, the native oxide removal step may not be required.

Figure 2:
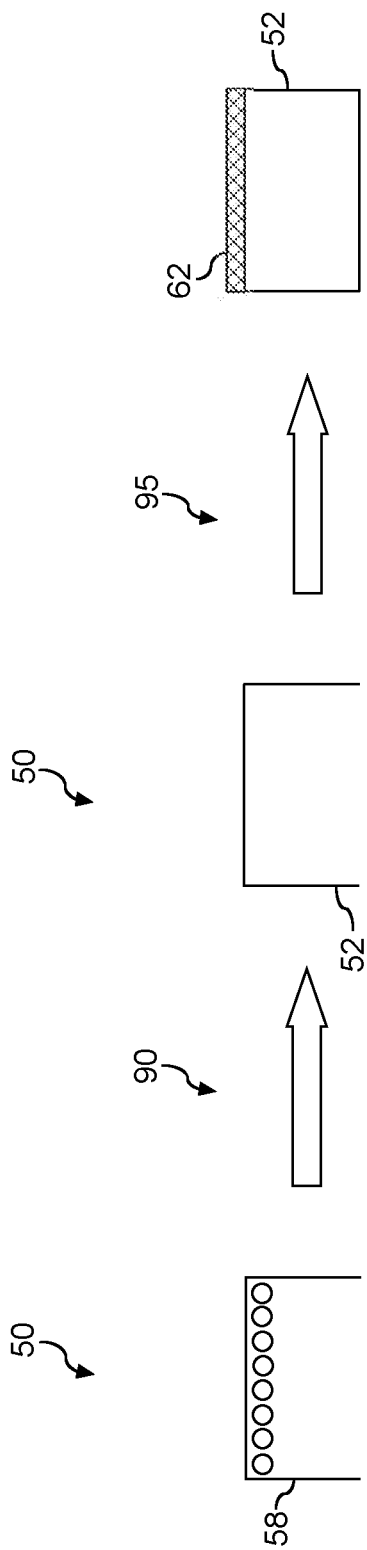
FIG. 2 depicts an example organic radical based surface treatment process on a structure according to example embodiments of the present disclosure.

FIG. 2 depicts an example organic radical based surface treatment process on a structure 50 according to example embodiments of the present disclosure. A high temperature (e.g., greater than 700° C.) pre-anneal step 90 according to example aspects of the present disclosure can be conducted on the methylated substrate 58 to remove organic radicals such that oxidation-free surface of the substrate 52 can be exposed. An epitaxial film deposition process 95 according to example aspects of the present disclosure can then be conducted on the oxidation-free surface of the substrate 52 such that one or more epitaxial films can be deposited on top of the substrate 52.

Figure 3:
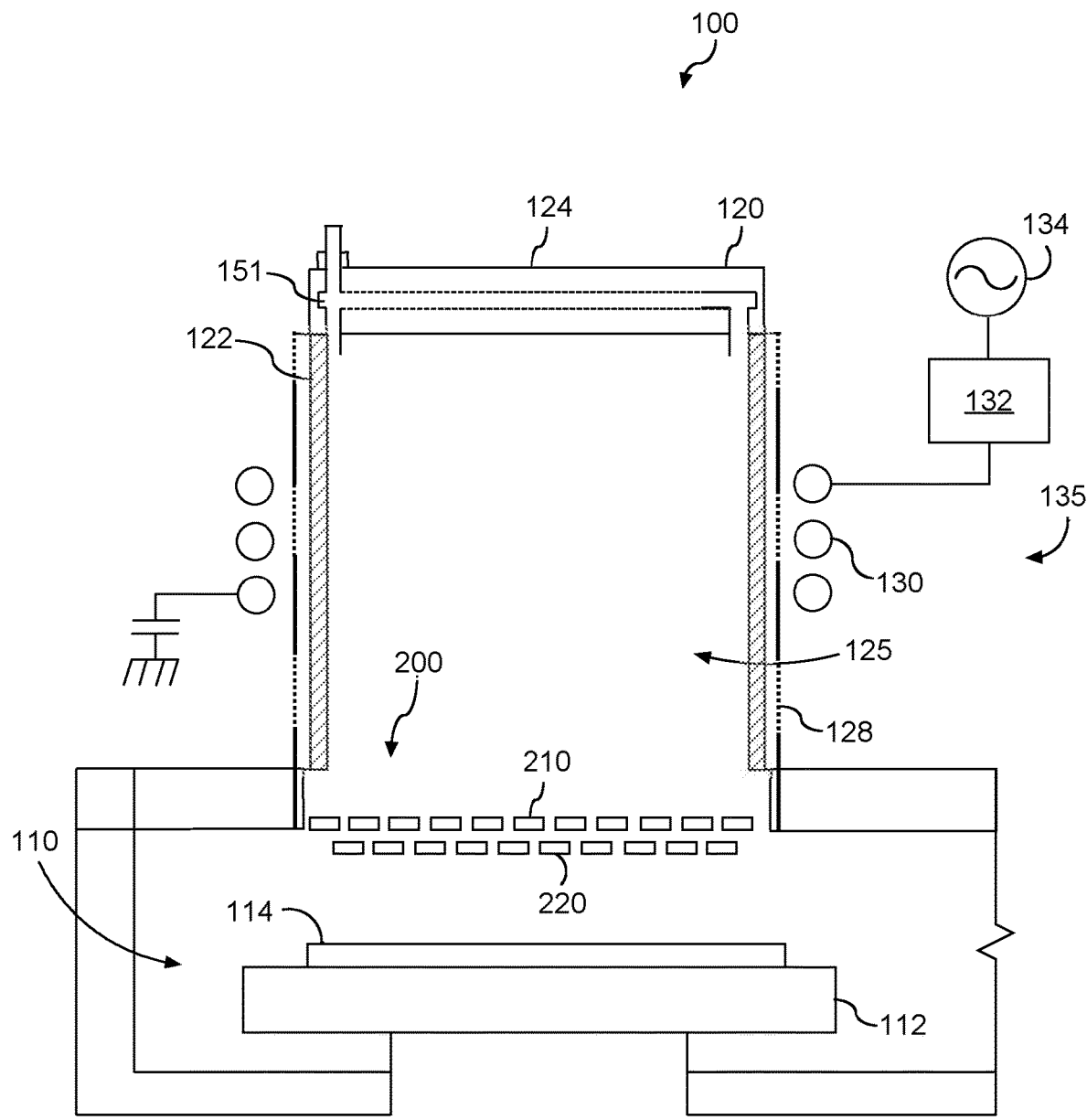
FIG. 3 depicts an example plasma processing apparatus according to example embodiments of the present disclosure.

FIG. 3 depicts an example plasma processing apparatus 100 according to example embodiments of the present disclosure. As illustrated, the plasma processing apparatus 100 includes a processing chamber 110 and a plasma chamber 120 that is separated from the processing chamber 110. The processing chamber 110 includes a substrate holder or pedestal 112 operable to hold a workpiece 114 to be processed, such as a semiconductor wafer. In this example illustration, a plasma is generated in the plasma chamber 120 (i.e., plasma generation region) by an inductively coupled plasma source 135 and desired species are channeled from the plasma chamber 120 to the surface of substrate 114 through a separation grid assembly 200.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

The plasma chamber 120 includes a dielectric side wall 122 and a ceiling 124. The dielectric side wall 122, the ceiling 124, and the separation grid 200 define a plasma chamber interior 125. The dielectric side wall 122 can be formed from a dielectric material, such as quartz and/or alumina. The inductively coupled plasma source 135 can include an induction coil 130 disposed adjacent to the dielectric side wall 122 above the plasma chamber 120. The induction coil 130 is coupled to an RF power generator 134 through a suitable matching network 132. Process gases (e.g., reactant and/or carrier gases) can be provided to the chamber interior from a gas supply 150 and an annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 3, the separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber 110.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern with a plurality of holes. The second grid plate 220 can have a second grid pattern with a plurality of holes. The first grid pattern can be the same as or different from the second grid pattern. Charged particles can recombine on the walls in their path through the holes of each grid plate 210, 220 in the separation grid 200. Neutrals (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

Figure 4:
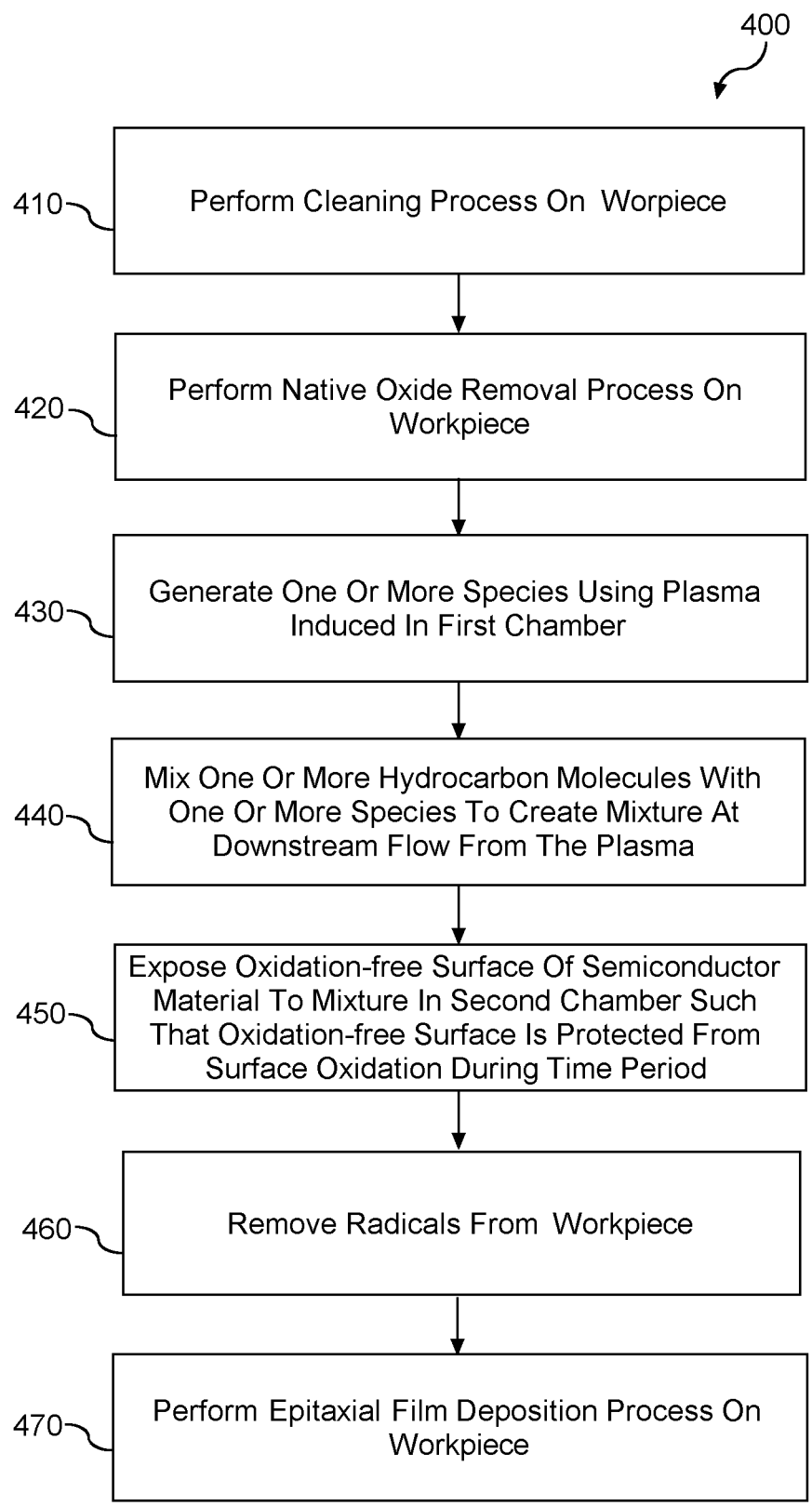
FIG. 4 depicts a flow diagram of an example method for protecting a workpiece from oxidation according to example aspects of the present disclosure.

FIG. 4 depicts a flow diagram of an example method (400) for protecting a workpiece from oxidation according to example aspects of the present disclosure. The method (400) can be implemented using the plasma processing apparatus 100. However, as will be discussed in detail below, the organic radical based surface treatment processes according to example aspects of the present disclosure can be implemented using other approaches without deviating from the scope of the present disclosure. FIG. 4 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (410), the method can include performing a cleaning process on a workpiece. For instance, a cleaning process 60 can be conducted on the workpiece 114 to remove one or more damaged layers of the workpiece 114. The cleaning process 60 can include, for instance, a plasma etch process, a wet chemical process, or other suitable process.

At (420), the method can include performing a native oxide removal process on the workpiece. For instance, a native oxide removal process 70 can be conducted on the workpiece 114 to remove one or more native oxide layers caused by surface oxidation after the cleaning process 60. The native oxide removal process can include, for instance, a plasma dry etch process, a wet chemical process, etc.

At (430), the method can include generating one or more species using a plasma induced in a first chamber. For instance, a process gas can be admitted into the plasma chamber interior 125 from the gas source 150 via the annular gas distribution channel 151 or other suitable gas introduction mechanism. In some embodiments, the process gas can include a reactive gas, such as hydrogen gas ($H_2$). For instance, the hydrogen gas can be admitted into the plasma chamber as part of a process gas. The process gas can include a mixture including $H_2$ and $N_2$ and/or a mixture including $H_2$ and He and/or a mixture including $H_2$ and Ar. In some embodiments, the process gas is an inert gas, such as helium, argon, or xenon. The induction coil 130 can be energized with RF energy from the RF power generator 134 to generate a plasma in the plasma chamber interior 125. In some embodiments, the inductively coupled power source 135 can be energized with pulsed power to obtain desired radicals with reduced plasma energy. The induced plasma in the plasma chamber 120 can generate one or more species. For instance, a plasma induced in the plasma chamber interior 125 from a reactive process gas (e.g., $H_2$) using the inductively coupled plasma source 135 can dissociate molecules in the process gas mixture to generate radicals (e.g. H radicals) and ions. As another example, a plasma induced in the plasma chamber interior 125 from an inert process gas (e.g., He) using the inductively coupled plasma source 135 can generate one or more excited inert gas molecules (e.g., excited He atoms).

At (440), the method can include mixing one or more hydrocarbon molecules with one or more species to create a mixture at downstream flow from the plasma. For instance, the species generated by a plasma can flow downstream from the plasma towards a workpiece. In some embodiments, as shown in FIG. 3, the plasma chamber 120 and the processing chamber 110 can be separated by the separation grid assembly 200. As one example, one or more hydrocarbon molecules can be mixed with the one or more species in the plasma chamber 120 at downstream flow from the plasma. As another example, one or more hydrocarbon molecules can be mixed with the one or more species in the processing chamber 110 at downstream flow from the plasma. In some embodiments, the separation grid assembly 200 is optional. The plasma chamber 120 and the processing chamber 110 can be contiguous to form a single chamber. As one example, one or more hydrocarbon molecules can be mixed with the one or more species at a downstream flow location (e.g., a location proximate to the plasma, a location proximate to the workpiece) from a plasma to the workpiece in the single chamber.

Example hydrocarbon molecules can include, for instance, non-cyclic alkanes $C_nH_{2n+2}$ where n is greater than or equal to one and less than or equal to 10. For instance, the hydrocarbon molecules can include non-cyclic alkanes, such as methane $CH_4$, ethane $C_2H_6$, propane or iso-propane $C_3H_8$, etc. The hydrocarbon molecule(s) can include cyclic alkanes $C_nH_{2n}$, where n is greater than or equal to five and less than or equal to ten. For instance, the hydrocarbon molecule(s) can include cyclic alkanes such as cyclopentane $C_5H_{10}$, cyclohexane $C_6H_{12}$, methyl-cyclohexane, $C_7H_{14}$, dimethyl-cyclohexane $C_8H_{16}$, 1,3,5-trimethyl-cyclohexane $C_9H_{18}$, etc. In some embodiments, the hydrocarbon molecule(s) can include alkenes $C_nH_{2n}$, where n is greater than or equal to one and less than or equal to ten, such as ethylene $C_2H_4$, propene $C_3H_6$, etc.

At (450), the method can include expose an oxidation-free surface of the workpiece to the mixture in the second chamber such that the oxidation-free surface can be protected from surface oxidation during a time period. For instance, an oxidation-free surface of the workpiece 114 can be exposed to the mixture (e.g., $CH_3$ radicals) in the processing chamber 110 such that the oxidation-free surface can be protected from surface oxidation during a time period (e.g., days).

At (460), the method can include removing organic radicals from the workpiece. For instance, a high-temperature pre-anneal step 90 can be conducted on the surface of the workpiece 114 to remove the organic radicals.

At (470), the method can include performing an epitaxial film deposition process on the workpiece. For instance, an epitaxial film deposition process 95 can be conducted on the workpiece 114 to deposit one or more epitaxial films on the oxidation-free surface of the workpiece 114.

The organic radical based surface treatment process can be implemented using other approaches without deviating from the scope of the present disclosure. For instance, in some embodiments, the organic radicals can be generated in the plasma chamber.

In some embodiments, the process gas can include one or more hydrocarbon molecules. Example hydrocarbon molecules can include, for instance, non-cyclic alkanes $C_nH_{2n+2}$ where n is greater than or equal to one and less than or equal to 10. For instance, the hydrocarbon molecules can include non-cyclic alkanes, such as methane $CH_4$, ethane $C_2H_6$, propane or iso-propane $C_3H_8$, etc.

In some embodiments, the hydrocarbon molecules can include cyclic alkanes $C_nH_{2n}$, where n is greater than or equal to five and less than or equal to ten. For instance, the hydrocarbon precursor can include cyclic alkanes such as cyclopentane $C_5H_{10}$, cyclohexane $C_6H_{12}$, methyl-cyclohexane, $C_7H_{14}$, dimethyl-cyclohexane $C_8H_{16}$, 1,3,5-trimethyl-cyclohexane $C_9H_{18}$, etc. In some embodiments, the hydrocarbon precursors can include alkenes $C_nH_{2n}$, where n is greater than or equal to two and less than or equal to ten, such as ethylene $C_2H_4$, propene $C_3H_6$, etc.

In some embodiments (not shown in FIG. 4), the method can include dissociating one or more hydrocarbon molecules in the mixture in the plasma chamber interior using the plasma. For instance, a plasma induced in the plasma chamber interior 125 using the inductively coupled plasma source 135 can dissociate hydrocarbon molecules and other molecules in the process gas to generate radicals and ions. For instance, the one or more hydrocarbon molecules can be dissociated in the plasma to generate organic radicals, such as $CH_3$ radicals.

The organic radical based surface treatment process can be implemented using other approaches without deviating from the scope of the present disclosure. For instance, in some embodiments, the organic radicals can be generated post filtering.

Figure 5:
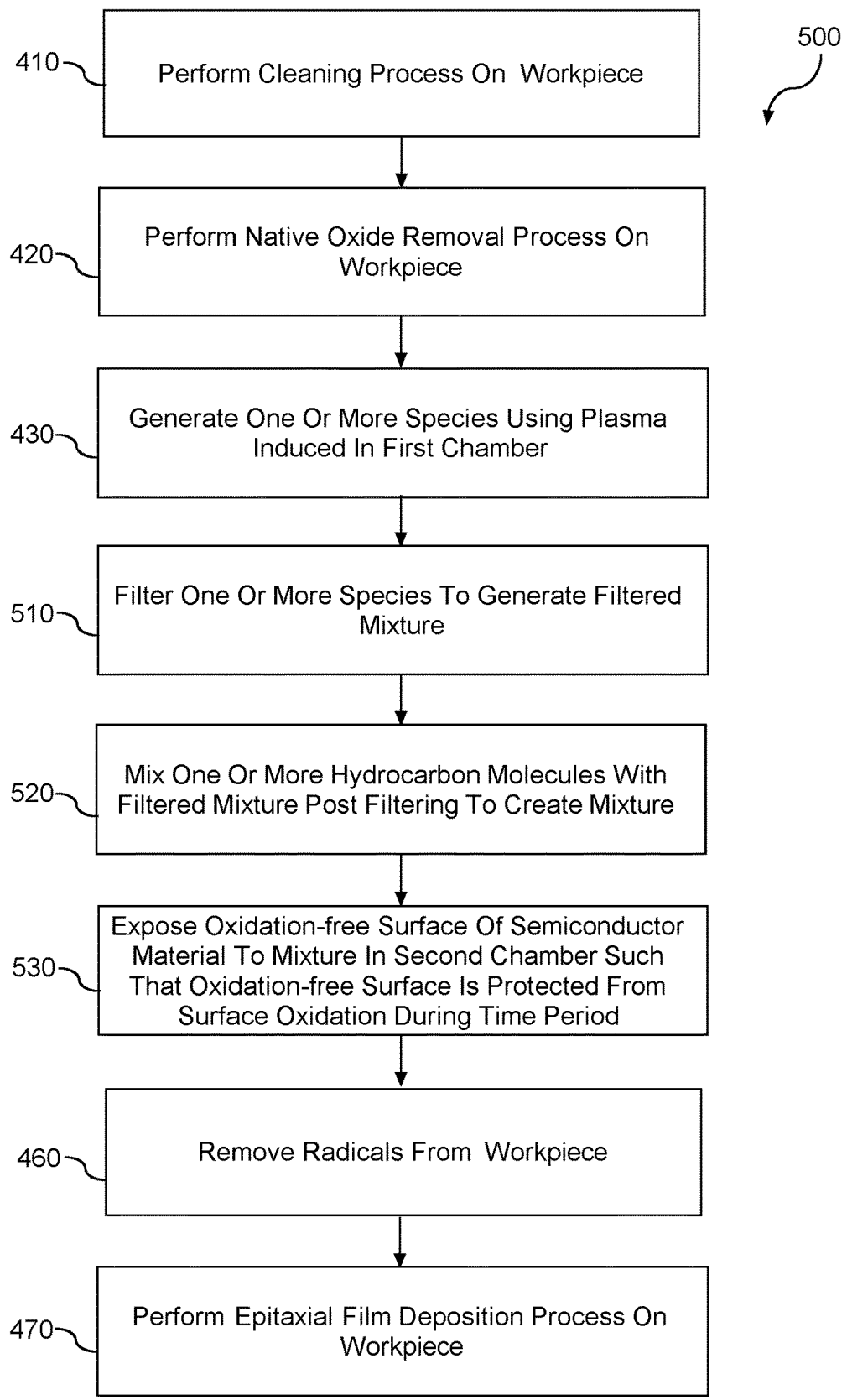
FIG. 5 depicts a flow diagram of an example method for protecting a workpiece from oxidation according to example aspects of the present disclosure.

FIG. 5 depicts a flow diagram of an example method (500) for protecting a workpiece from oxidation according to example aspects of the present disclosure. The method (500) can be implemented using the plasma processing apparatus 100. However, as will be discussed in detail below, the organic radical based surface treatment processes according to example aspects of the present disclosure can be implemented using other approaches without deviating from the scope of the present disclosure. FIG. 5 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (410), the method can include performing a cleaning process on a workpiece. For instance, a cleaning process 60 can be conducted on the workpiece 114 to remove one or more damaged layers of the workpiece 114. The cleaning process 60 can include, for instance, a plasma etch process, a wet chemical process, or other suitable process.

At (420), the method can include performing a native oxide removal process on the workpiece. For instance, a native oxide removal process 70 can be conducted on the workpiece 114 to remove one or more native oxide layers caused by surface oxidation after the cleaning process 60. The native oxide removal process can include, for instance, a plasma dry etch process, a wet chemical process, etc.

At (430), the method can include generating one or more species using a plasma induced in a first chamber. For instance, a process gas can be admitted into the plasma chamber interior 125 from the gas source 150 via the annular gas distribution channel 151 or other suitable gas introduction mechanism. In some embodiments, the process gas can include a reactive gas, such as hydrogen gas ($H_2$). For instance, the hydrogen gas can be admitted into the plasma chamber as part of a process gas. The process gas can include a mixture including $H_2$ and $N_2$ and/or a mixture including $H_2$ and He and/or a mixture including $H_2$ and Ar. In some embodiments, the process gas is an inert gas, such as helium, argon, or xenon. The induction coil 130 can be energized with RF energy from the RF power generator 134 to generate a plasma in the plasma chamber interior 125. In some embodiments, the inductively coupled power source 135 can be energized with pulsed power to obtain desired radicals with reduced plasma energy. The induced plasma in the plasma chamber 120 can generate one or more species. For instance, a plasma induced in the plasma chamber interior 125 from a reactive process gas (e.g., $H_2$) using the inductively coupled plasma source 135 can dissociate molecules in the process gas mixture to generate radicals (e.g. H radicals) and ions. As another example, a plasma induced in the plasma chamber interior 125 from an inert process gas (e.g., He) using the inductively coupled plasma source 135 can generate one or more excited inert gas molecules (e.g., excited He atoms).

At (510), the method include filtering one or more species to generate a filtered mixture. In some embodiments, the one or more species can be filtered using a separation grid assembly separating the plasma chamber from a processing chamber where the workpiece is located. For instance, the separation grid 200 can be used to filter ions generated by the plasma.

The separation grid 200 can have a plurality of holes. Charged particles (e.g., ions) can recombine on the walls in their path through the plurality of holes. Neutral particles (e.g., radicals) can pass through the holes. In some embodiments, the separation grid 200 can be configured to filter ions with an efficiency greater than or equal to about 90%, such as greater than or equal to about 95%.

In some embodiments, the separation grid can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

At (520), the method can include mixing hydrocarbon molecules with the filtered mixture post filtering to create a mixture. The hydrocarbon molecules can react with hydrogen radical to generate desired radicals (e.g., $CH_3$ radicals).

Example hydrocarbon molecules can include, for instance, non-cyclic alkanes $C_nH_{2n+2}$ where n is greater than or equal to one and less than or equal to 10. For instance, the hydrocarbon molecules can include non-cyclic alkanes, such as methane $CH_4$, ethane $C_2H_6$, propane or iso-propane $C_3H_8$, etc. The hydrocarbon molecule(s) can include cyclic alkanes $C_nH_{2n}$, where n is greater than or equal to five and less than or equal to ten. For instance, the hydrocarbon molecule(s) can include cyclic alkanes such as cyclopentane $C_5H_{10}$, cyclohexane $C_6H_{12}$, methyl-cyclohexane, $C_7H_{14}$, dimethyl-cyclohexane $C_8H_{16}$, 1,3,5-trimethyl-cyclohexane $C_9H_{18}$, etc. In some embodiments, the hydrocarbon molecule(s) can include alkenes $C_nH_{2n}$, where n is greater than or equal to one and less than or equal to ten, such as ethylene $C_2H_4$, propene $C_3H_6$, etc.

In some embodiments, one or more hydrocarbon molecules can be mixed with the one or more species in the plasma chamber 120 at downstream flow from the plasma. In some embodiments, one or more hydrocarbon molecules can be mixed with the one or more species in the processing chamber 110 at downstream flow from the plasma.

At (530), the method can include expose an oxidation-free surface of the workpiece to the mixture in the second chamber such that the oxidation-free surface can be protected from surface oxidation during a time period. For instance, an oxidation-free surface of the workpiece 114 can be exposed to the mixture (e.g., $CH_3$ radicals) in the processing chamber 110 such that the oxidation-free surface can be protected from surface oxidation during a time period (e.g., days).

At (460), the method can include removing organic radicals from the workpiece. For instance, a high-temperature pre-anneal step 90 can be conducted on the surface of the workpiece 114 to remove the organic radicals.

At (470), the method can include performing an epitaxial film deposition process on the workpiece. For instance, an epitaxial film deposition process 95 can be conducted on the workpiece 114 to deposit one or more epitaxial films on the oxidation-free surface of the workpiece 114.

The organic radical based surface treatment process can be implemented using other approaches without deviating from the scope of the present disclosure. For instance, in some embodiments, the organic radicals can be generated in the plasma chamber.

In some embodiments, the process gas can include one or more hydrocarbon molecules. Example hydrocarbon molecules can include, for instance, non-cyclic alkanes $C_nH_{2n+2}$ where n is greater than or equal to one and less than or equal to 10. For instance, the hydrocarbon molecules can include non-cyclic alkanes, such as methane $CH_4$, ethane $C_2H_6$, propane or iso-propane $C_3H_8$, etc.

In some embodiments, the hydrocarbon molecules can include cyclic alkanes $C_nH_{2n}$, where n is greater than or equal to five and less than or equal to ten. For instance, the hydrocarbon precursor can include cyclic alkanes such as cyclopentane $C_5H_{10}$, cyclohexane $C_6H_{12}$, methyl-cyclohexane, $C_7H_{14}$, dimethyl-cyclohexane $C_8H_{16}$, 1,3,5-trimethyl-cyclohexane $C_9H_{18}$, etc. In some embodiments, the hydrocarbon precursors can include alkenes $C_nH_{2n}$, where n is greater than or equal to two and less than or equal to ten, such as ethylene $C_2H_4$, propene $C_3H_6$, etc.

In some embodiments (not shown in FIG. 5), the method can include dissociating one or more hydrocarbon molecules in the mixture in the plasma chamber interior using the plasma. For instance, a plasma induced in the plasma chamber interior 125 using the inductively coupled plasma source 135 can dissociate hydrocarbon molecules and other molecules in the process gas to generate radicals and ions. For instance, the one or more hydrocarbon molecules can be dissociated in the plasma to generate organic radicals, such as $CH_3$ radicals.

In some embodiments (not shown in FIG. 5), the method can further include filtering one or more ions generated by the plasma in the mixture to create a filtered mixture. The filtered mixture can include radicals generated by dissociation of the hydrocarbon molecules, such as $CH_3$ radicals.

In some embodiments, the one or more ions can be filtered using a separation grid assembly separating the plasma chamber from a processing chamber where the workpiece is located. For instance, the separation grid 200 can be used to filter ions generated by the plasma. The separation grid 200 can have a plurality of holes. Charged particles (e.g., ions) can recombine on the walls in their path through the plurality of holes. Neutrals (e.g., radicals such as $CH_3$ radicals) can pass through the holes.

In some embodiments, the separation grid 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

For instance, the separation grid 200 can have a first grid plate 210 and a second grid plate 220 in parallel relationship with one another. The first grid plate 210 can have a first grid pattern having a plurality of holes. The second grid plate 220 can have a second grid pattern having a plurality of holes.

The first grid pattern can be the same as or different from the second grid pattern. Charged particles (e.g., ions) can recombine on the walls in their path through the holes of each grid plate 210, 220 in the separation grid 200. Neutral species (e.g., radicals) can flow relatively freely through the holes in the first grid plate 210 and the second grid plate 220.

In some embodiments, the method can further include exposing an oxidation-free surface of the workpiece to the mixture in the second chamber such that the oxidation-free surface can be protected from surface oxidation during a time period. More particularly, the workpiece can be exposed to radicals (e.g., $CH_3$ radicals) generated in the plasma and passing through the separation grid assembly. As an example, organic radicals (e.g., $CH_3$ radicals) can pass through the separation grid 200 and be exposed on the workpiece 114. In some embodiments, exposing the workpiece to organic radicals can result in attachment of organic radicals on at least a portion of the semiconductor material.

Figure 6:
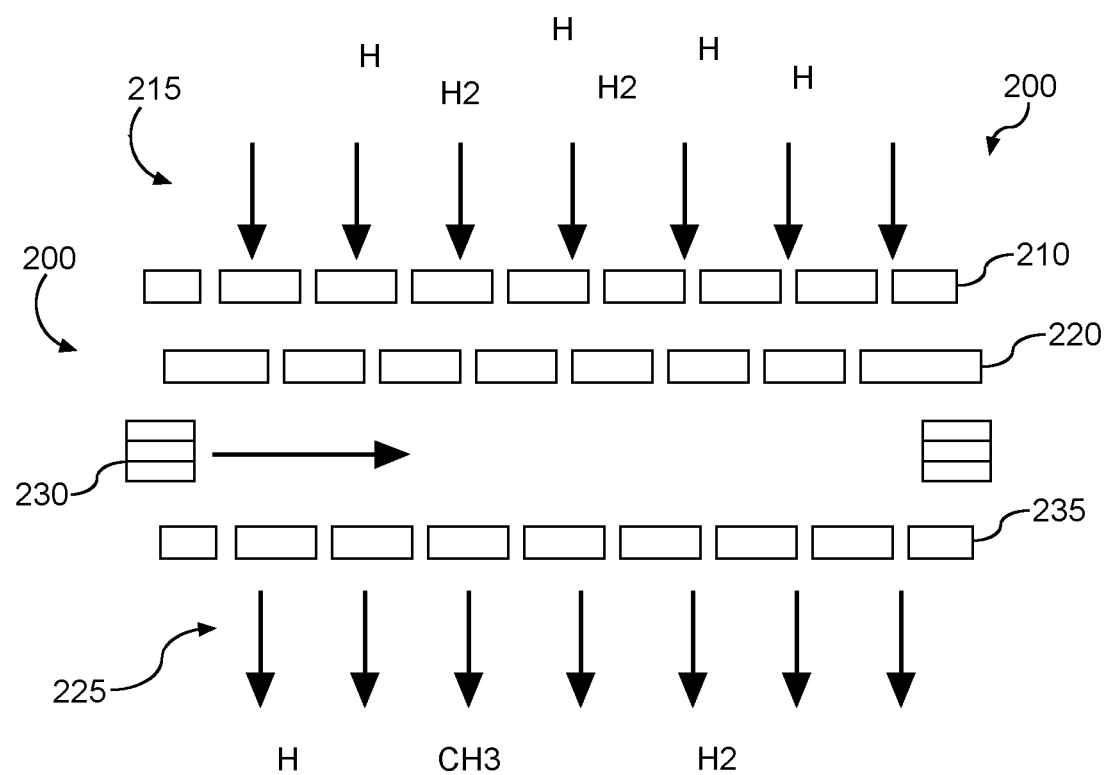
FIG. 6 depicts example post plasma gas injection during a surface treatment process according to example embodiments of the present disclosure.

FIG. 6 depicts example post plasma gas injection during a surface treatment process according to example embodiments of the present disclosure. More particularly, the separation grid 200 includes a first grid plate 210 and a second grid plate 220 disposed in parallel relationship for ion/UV filtering.

The first grid plate 210 and a second grid plate 220 can be in parallel relationship with one another. The first grid plate 210 can have a first grid pattern having a plurality of holes. The second grid plate 220 can have a second grid pattern having a plurality of holes. The first grid pattern can be the same as or different from the second grid pattern. Neutral and charged particles 215 from the plasma can be exposed to the separation grid 200. Charged particles (e.g., ions) can recombine on the walls in their path through the holes of each grid plate 210, 220 in the separation grid 200. Neutral species (e.g., H radicals or excited inert gas molecules) can flow relatively freely through the holes in the first grid plate 210 and the second grid plate 220.

Subsequent to the second grid plate 220, a gas injection source 230 can be configured to admit hydrocarbon gas into the filtered mixture. Radicals (e.g., $CH_3$ radicals) 225 resulting from the injection of hydrocarbon gas can pass through a third grid plate 235 for exposure to the workpiece.

The present example is discussed with reference to a separation grid with three grid plates for example purposes. Those of ordinary skill in the art, using the disclosures provided herein, will understand that more or fewer grid plates can be used without deviating from the scope of the present disclosure.

At (530) of FIG. 5, the method can include exposing the workpiece to the filtered mixture. More particularly, the workpiece can be exposed to radicals (e.g., $CH_3$ radicals) after injection of the hydrocarbon molecules. As an example, radicals (e.g., $CH_3$ radicals) can pass through the third grid plate 235 (FIG. 6) and can be exposed on the workpiece 114. In some embodiments, exposing the workpiece to organic radicals can result in methylation of at least a portion of the semiconductor material.

Figure 7:
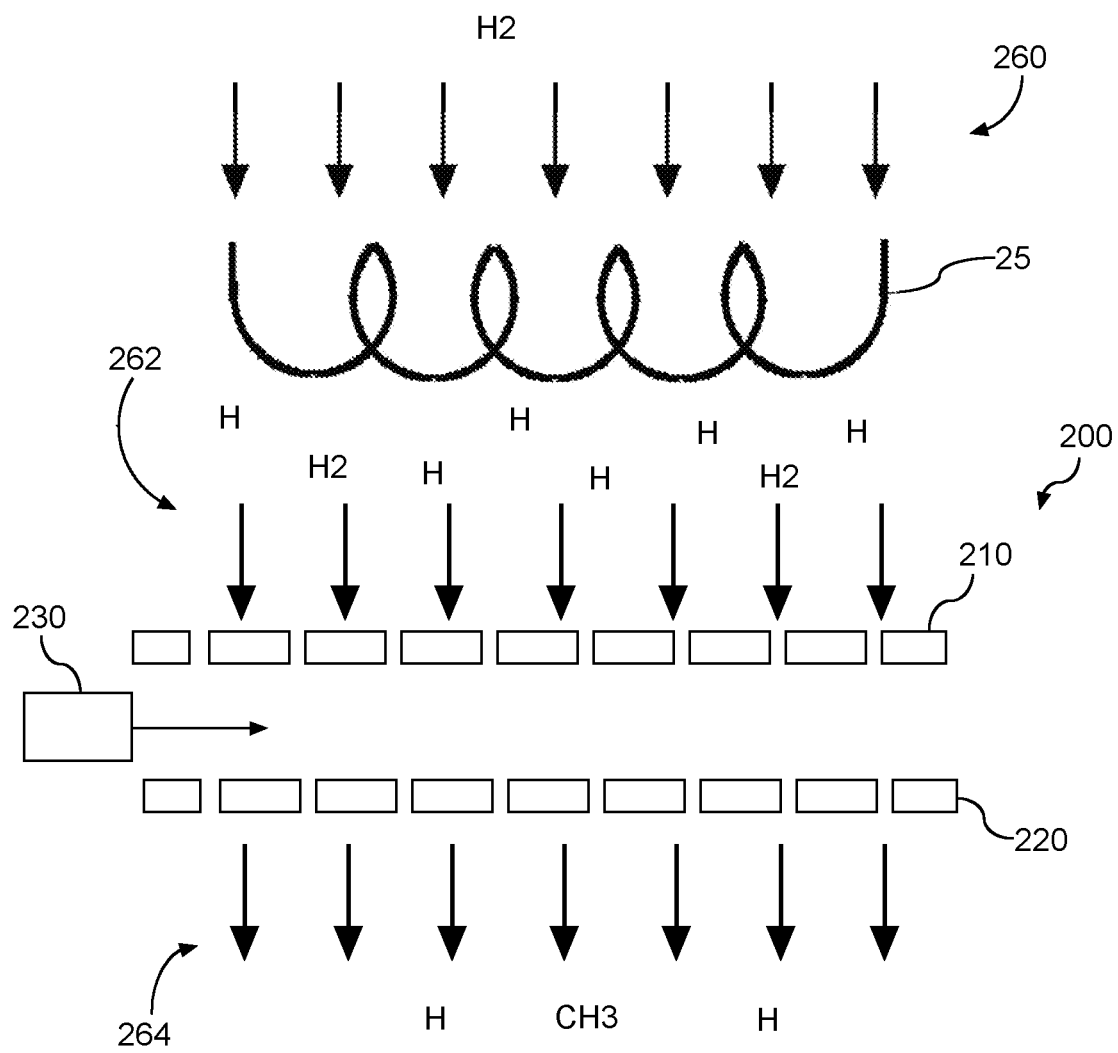
FIG. 7 depicts an example source of hydrogen radicals according to example embodiments of the present disclosure.

In some embodiments, the hydrogen radicals can be generated using a different source of hydrogen radicals. For instance, FIG. 7 depicts an example source of hydrogen radicals according to example embodiments of the present disclosure. As shown in FIG. 7, a hydrogen gas $H_2$ can be passed over a heated filament (e.g., a tungsten filament) to generate hydrogen radicals in a first chamber. The hydrogen radicals can be passed through the separation grid 200.

The separation grid 200 includes a first grid plate 210 and a second grid plate 220 disposed in parallel relationship. The first grid plate 210 can have a first grid pattern having a plurality of holes. The second grid plate 220 can have a second grid pattern having a plurality of holes. The first grid pattern can be the same as or different from the second grid pattern.

Subsequent to the first grid plate 210, the gas injection source 230 can be configured to admit hydrocarbon gas into the filtered mixture. Radicals (e.g., $CH_3$) radicals 264 resulting from the injection of hydrocarbon gas can pass through the second grid plate 220 for exposure to the workpiece.

The hydrocarbon gas can include one or more hydrocarbon molecules. Example hydrocarbon molecules can include, for instance, non-cyclic alkanes $C_nH_{2n+2}$ where n is greater than or equal to one and less than or equal to 10. For instance, the hydrocarbon molecules can include non-cyclic alkanes, such as methane $CH_4$, ethane $C_2H_6$, propane or iso-propane $C_3H_8$, etc. The hydrocarbon molecule(s) can include cyclic alkanes $C_nH_{2n}$, where n is greater than or equal to five and less than or equal to ten. For instance, the hydrocarbon molecule(s) can include cyclic alkanes such as cyclopentane $C_5H_{10}$, cyclohexane $C_6H_{12}$, methyl-cyclohexane, $C_7H_{14}$, dimethyl-cyclohexane $C_8H_{16}$, 1,3,5-trimethyl-cyclohexane $C_9H_{18}$, etc. In some embodiments, the hydrocarbon molecule(s) can include alkenes $C_nH_{2n}$, where n is greater than or equal to one and less than or equal to ten, such as ethylene $C_2H_4$, propene $C_3H_6$, etc.

The present example is discussed with reference to a separation grid with two grid plates for example purposes. Those of ordinary skill in the art, using the disclosures provided herein, will understand that more or fewer grid plates can be used without deviating from the scope of the present disclosure.

The organic radicals (e.g., $CH_3$ radicals) can be generated using other approaches with deviating from the scope of the present disclosure. As one example, organic radicals (e.g., $CH_3$ radicals) can be generated using pyrolysis (thermal decomposition) of molecules (e.g., azomethane $CH_3$—N=N—$CH_3$). As another example, organic radicals can be generated or UV-assisted molecule dissociation (e.g., acetone $CH_3COCH_3$).

The surface treatment processes according to example aspects of the present disclosure can be implemented in other suitable plasma processing apparatus. For instance, the surface treatment processes according to example embodiments of the present disclosure can be implemented using the example apparatus shown in FIG. 8 and the example apparatus shown in FIG. 9 discussed in detail below.

Figure 8:
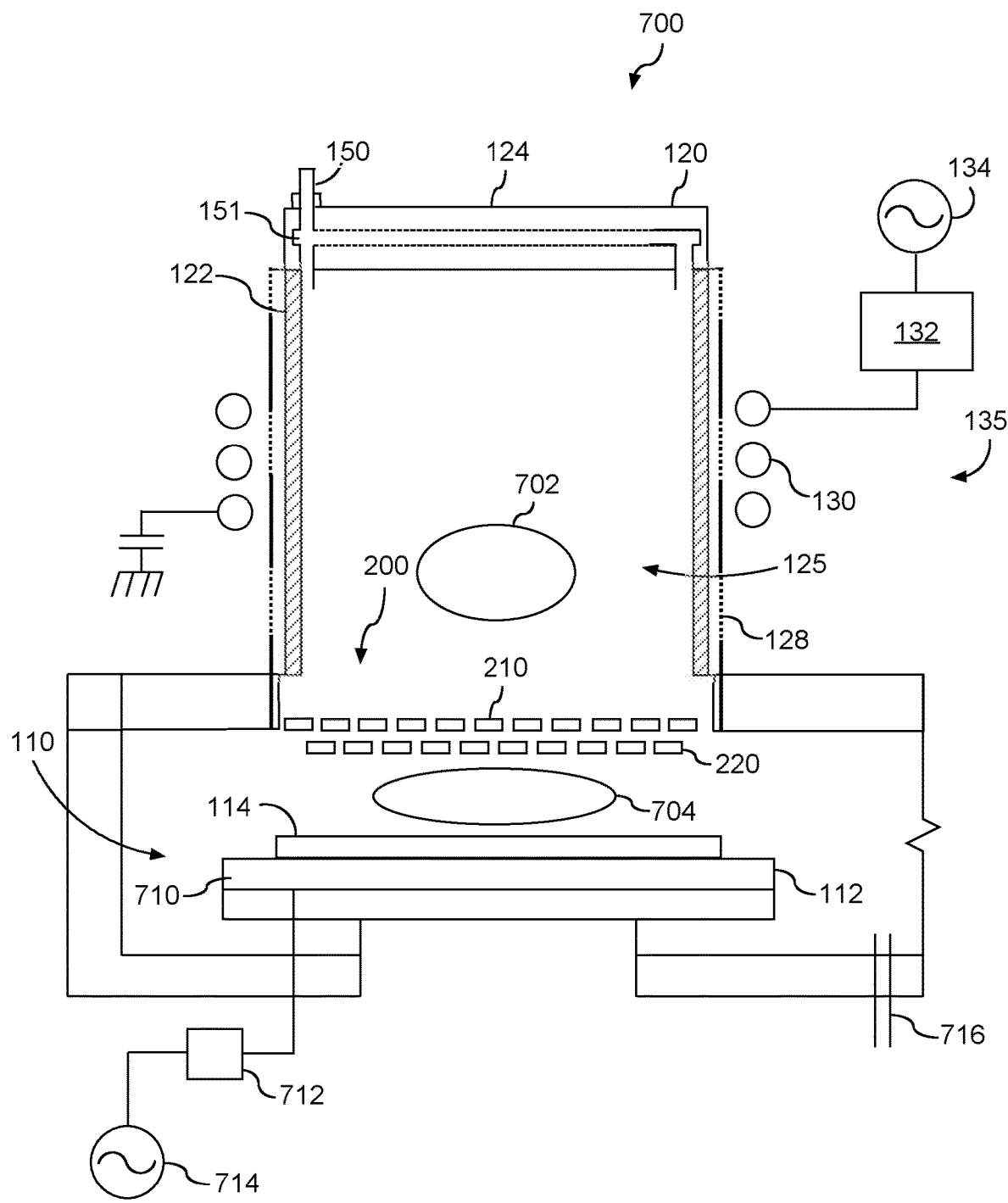
FIG. 8 depicts an example plasma processing apparatus according to example embodiments of the present disclosure.

FIG. 8 depicts an example plasma processing apparatus 700 that can be used to implement processes according to example embodiments of the present disclosure. The plasma processing apparatus 700 is similar to the plasma processing apparatus 100 of FIG. 3.

More particularly, plasma processing apparatus 700 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent to the dielectric side wall 122 above the plasma chamber 120. The induction coil 130 is coupled to an RF power generator 134 through a suitable matching network 132. Process gases (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 8, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 700 of FIG. 8 is operable to generate a first plasma 702 (e.g., a remote plasma) in the plasma chamber 120 and a second plasma 704 (e.g., a direct plasma) in the processing chamber 110. As used herein, a "remote plasma" refers to a plasma generated remotely from a workpiece, such as in a plasma chamber separated from a workpiece by a separation grid. As used herein, a "direct plasma" refers to a plasma that is directly exposed to a workpiece, such as a plasma generated in a processing chamber having a pedestal operable to support the workpiece.

More particularly, the plasma processing apparatus 700 of FIG. 8 includes a bias source having bias electrode 710 in the pedestal 112. The bias electrode 710 can be coupled to an RF power generator 714 via a suitable matching network 712. When the bias electrode 710 is energized with RF energy, a second plasma 704 can be generated from a mixture in the processing chamber 110 for direct exposure to the workpiece 114. The processing chamber 110 can include a gas exhaust port 716 for evacuating a gas from the processing chamber 110. The species used in the oxide removal processes according to example aspects of the present disclosure can be generated using the first plasma 702 and/or the second plasma 704.

Figure 9:
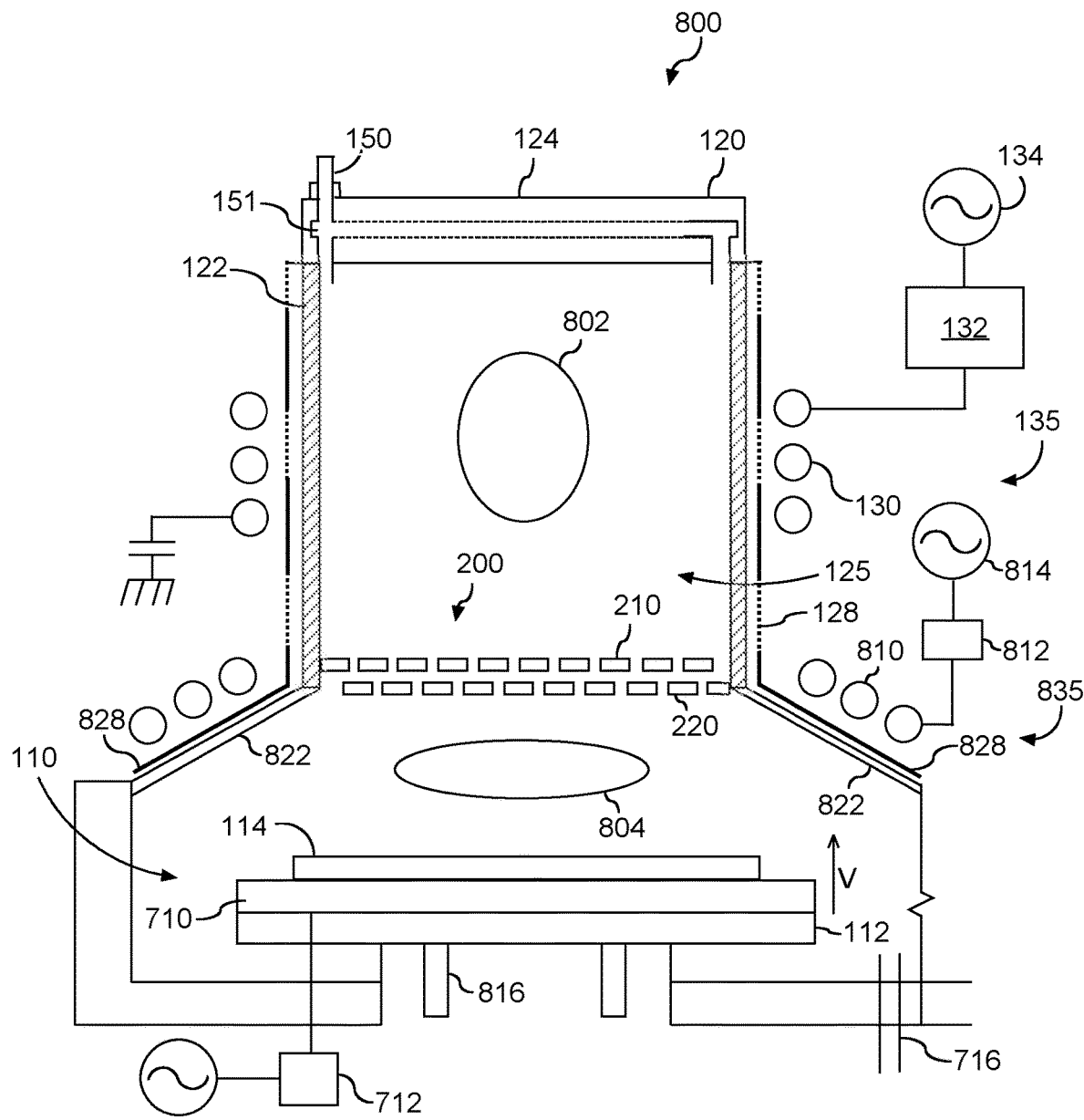
FIG. 9 depicts an example plasma processing apparatus according to example embodiments of the present disclosure.

FIG. 9 depicts a processing chamber 800 similar to that of FIG. 3 and FIG. 8. More particularly, plasma processing apparatus 800 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gas (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 9, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 800 of FIG. 9 is operable to generate a first plasma 802 (e.g., a remote plasma) in the plasma chamber 120 and a second plasma 804 (e.g., a direct plasma) in the processing chamber 110. As shown, the plasma processing apparatus 800 can include an angled dielectric sidewall 822 that extends from the vertical sidewall 122 associated with the remote plasma chamber 120. The angled dielectric sidewall 822 can form a part of the processing chamber 110.

A second inductive plasma source 835 can be located proximate the dielectric sidewall 822. The second inductive plasma source 835 can include an induction coil 810 coupled to an RF generator 814 via a suitable matching network 812. The induction coil 810, when energized with RF energy, can induce a direct plasma 804 from a mixture in the processing chamber 110. A Faraday shield 828 can be disposed between the induction coil 810 and the sidewall 822.

The pedestal 112 can be movable in a vertical direction noted as "V." For instance, the pedestal 112 can include a vertical lift 816 that can be configured to adjust a distance between the pedestal 112 and the separation grid assembly 200. As one example, the pedestal 112 can be located in a first vertical position for processing using the remote plasma 802. The pedestal 112 can be in a second vertical position for processing using the direct plasma 804. The first vertical position can be closer to the separation grid assembly 200 relative to the second vertical position.

The plasma processing apparatus 800 of FIG. 9 includes a bias source having bias electrode 710 in the pedestal 112. The bias electrode 710 can be coupled to an RF power generator 714 via a suitable matching network 712. The processing chamber 110 can include a gas exhaust port 716 for evacuating a gas from the processing chamber 110.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece, the workpiece comprising a semiconductor material, the method comprising:
    performing an organic radical based surface treatment process on the workpiece, the organic radical based surface treatment process comprising:
    generating one or more species from a process gas using a plasma generated in a first chamber;
    mixing the one or more species with a first gas mixture to create a second mixture, the second mixture comprising organic radicals;
    exposing a surface of the semiconductor material to the second mixture in a second chamber such that at least a portion of the workpiece surface has a protective layer comprising at least the organic radicals;
    exposing the workpiece to air, at least the portion of the workpiece surface having the protective layer such that the portion of the workpiece surface having the protective layer is protected from oxidation when exposed to air;
    removing the organic radicals from the workpiece after exposing the workpiece to air;
    performing an epitaxial film deposition process to deposit an epitaxial film on the workpiece subsequent to removing the organic radicals from the workpiece.

2. The method of claim 1, further comprising performing a native oxide removal process on the semiconductor material to create an oxidation-free surface prior to the organic radical based surface treatment process.

3. The method of claim 1, further comprising performing a cleaning process on the semiconductor material to remove a damaged layer of the semiconductor material prior to the radical based surface treatment process.

4. The method of claim 1, wherein removing the organic radicals from the workpiece comprises performing a high temperature pre-anneal step.

5. The method of claim 1, wherein the semiconductor material comprises silicon.

6. The method of claim 1, wherein the semiconductor material comprises silicon germanium.

7. The method of claim 1, wherein the first mixture comprises one or more hydrocarbon molecules.

8. The method of claim 7, wherein the one or more hydrocarbon molecules have a chemical formula of $C_nH_{2n+2}$, where n is greater than or equal to 1 and less than or equal to 10.

9. The method of claim 7, wherein the one or more hydrocarbon molecules have a chemical formula of $C_nH_{2n}$, where n is greater than or equal to 2 and n is less than or equal to 10.

10. The method of claim 1, wherein the one or more organic radicals comprise a $CH_3$ radical.

11. The method of claim 1, wherein the organic radical based surface treatment process results in methylation on at least a portion of the semiconductor material.

12. The method of claim 1, wherein the process gas comprises an inert gas.

13. The method of claim 12, wherein the inert gas is helium.

14. The method of claim 1, wherein the process gas comprises a hydrogen gas and the species comprise hydrogen radicals.

15. The method of claim 1, wherein filtering the one or more species to create the first mixture comprises filtering the one or more species using a separation grid separating the first chamber from the second chamber.

* * * * *